United States Patent [19]

Barnes et al.

[11] Patent Number: 4,494,031
[45] Date of Patent: Jan. 15, 1985

[54] HIGH POWER ACOUSTIC WAVE ARRANGEMENT WITH $N^2$ PARALLEL-SERIES CONNECTED ACOUSTIC WAVE DEVICES

[75] Inventors: Christopher S. Barnes, Reigate; Paul A. Moore, Hove; Philip D. White, Chessington, all of England

[73] Assignee: U.S. Philips Corporation, New York, N.Y.

[21] Appl. No.: 475,800

[22] Filed: Mar. 16, 1983

[30] Foreign Application Priority Data

Mar. 24, 1982 [GB] United Kingdom ............. 8208659

[51] Int. Cl.³ .................... H03H 9/25; H01L 41/08
[52] U.S. Cl. ........................ 310/313 B; 310/313 R; 333/141; 333/154; 333/193
[58] Field of Search .......... 310/313 R, 313 A, 313 B, 310/313 D, 366, 334, 317; 333/150, 153, 154, 193, 195, 196, 141, 149, 187, 189; 367/152, 153, 155

[56] References Cited

U.S. PATENT DOCUMENTS

3,942,140 3/1976 Laker et al. .................... 333/193
3,987,367 10/1976 Hartemann .................... 333/150

Primary Examiner—J. D. Miller
Assistant Examiner—D. L. Rebsch
Attorney, Agent, or Firm—Robert T. Mayer; Bernard Franzblau

[57] ABSTRACT

$N^2$ acoustic wave devices (A,B,S,T; where N is an integer greater than unity) with substantially the same electrical impedance and transfer characteristics at a given operating frequency are electrically connected in a parallel-series arrangement which has substantially the same electrical impedance and transfer characteristics as any one of the individual $N^2$ devices, but an increased active device area. The increased active area reduces stress and alleviates acoustically-induced migration in the metal of, for example, transducer electrode fingers (6,7) of resonators at high power levels. The parallel-series arrangement consists of N groups, each of which comprises N devices (A,B or S,T), the corresponding pairs of terminals (4,54 and 54,55) of which are connected in series. Some terminals (54 or 55) may be common to two or more devices and some devices may have merged transducers in which the electrode fingers (6 or 7) of one transducer are a longitudinal extension of the fingers of a parallel transducer. In the case of multiport devices the input and output terminal pairs may be differently grouped as regards the individual devices to which they belong.

17 Claims, 11 Drawing Figures

HIGH POWER ACOUSTIC WAVE ARRANGEMENT WITH N² PARALLEL-SERIES CONNECTED ACOUSTIC WAVE DEVICES

This invention relates to acoustic wave device arrangements, more particularly but not exclusively to resonators for low noise oscillators in which the device arrangement has a desired electrical impedance value with an improved power handling capability. Such device arrangements may also be used in, for example, filters designed to operate at high power levels. The devices may be bulk acoustic wave devices or surface acoustic wave (SAW) devices.

The power dependence of ageing in SAW resonators is discussed in a paper of this title by W. R. Shreve et al published in the I.E.E.E. 1981 Ultrasonics Symposium Proceedings (I.E.E.E. Publication 81 CH 16 89.9) pages 94 to 99. The paper describes ageing experiments with one-port and two-port SAW resonators. Both of these acoustic wave devices comprise a piezo-electric substrate having a resonance cavity between a pair of acoustic-wave reflectors (which may be grooves in the substrate surface or metal strips on the substrate surface). The one-port resonator has a single transducer within the resonance cavity and a single pair of terminals which serves to couple power both into and out of the device. The two-port resonator has an input transducer with a pair of input terminals and an output transducer with a pair of output terminals. Each transducer has interdigitated electrode fingers. In the particular two-port resonators described, a grounded metal bar is also present in the center of the cavity between the transducers.

These SAW devices were found to age at a rate which increases with increased operating power. The major cause of the increased ageing rate is acoustically-induced migration in the metal of the electrode fingers, and the grounded center bar when present, and also the reflectors when of metal. This migration of the metal occurs at areas in the device where the mechanical stress is greatest, which tends to be towards the center of the cavity. The acoustically-induced migration is particularly severe in SAW resonators where there is a standing wave pattern established in the cavity, but also occurs in other SAW devices. This places a design limit on the peak stress which the device can reliably withstand and so limits the maximum power/unit active area which a particular device can reliably handle. For a quartz SAW device having pure aluminium metallization, the peak stress was found to be about $6 \times 10^7 N/m^2$. As described in the Shreve et al paper the acoustically-induced migration can be reduced by incorporating a small amount of copper into the metallization. However, experiments by the present applicants indicate that such copper doping of the metallization may decrease the Q factor of an acoustic wave resonator device and so is not always desirable.

The power handling capability of an acoustic wave device can be increased by increasing the active area of the device, thereby effectively reducing the relative power level per unit active area and so reducing the stress. However, the dimensions of the device are determined according to the electrical impedance, bandwidth and insertion loss characteristics which are desired for a particular device application. Increasing the active area of the device decreases the impedance from the desired value.

Similar considerations affect the ageing, power handling capability and impedance values of bulk acoustic wave devices.

According to the present invention there is provided an acoustic wave device arrangement comprising at least one piezo-electric substrate with $N^2$ acoustic wave devices having substantially the same electrical impedance and transfer characteristics, where N is an integer greater than unity. Each device has at least one pair of terminals for coupling power into and out of said device, said $N^2$ devices being electrically connected in a parallel-series arrangement consisting of N groups each of which comprises N of said devices, the corresponding pairs of terminals of which are electrically connected in series. The corresponding pairs of terminals in each group are electrically connected in parallel with the corresponding pairs of terminals in the other group or groups whereby the device arrangement has substantially the same electrical impedance and transfer characteristics as any one of the individual $N^2$ devices.

By adopting such a parallel-series arrangement of $N^2$ devices the whole acoustic wave device arrangement thus formed has electrical impedance and transfer characteristics which are substantially the same as those of any one individual device, while the active device area is increased by at least a factor of $N^2$. This increase in active device area results in the whole device arrangement is having an increased power handling capability. Thus, device arrangements in accordance with the invention can be used for filters designed to withstand high power levels, and are particularly important for low-noise oscillators and other resonators having fixed impedance levels but operating at the highest power levels possible in order to minimize the ratio of phase-noise power to carrier power.

As will be described more fully hereinafter with reference to several particular embodiments and the accompanying drawings, the $N^2$ devices can be discrete devices, or they can be integrated together to various degrees so forming simpler and particularly compact device structures on a single piezo-electric substrate. As a result, although the active device area is increased $N^2$ times, the substrate area required for the whole arrangement of $N^2$ devices can be considerably less than $N^2$ times the substrate area which would be required for one of the $N^2$ devices.

Thus, for example, the following levels of integration may be used. At least two of the $N^2$ devices may comprise transducer electrode fingers protruding from opposite sides of an electrode bus-bar portion which is a common terminal of said two devices and which forms part of either a series or parallel connection. A set of at least two of said $N^2$ devices may be connected together in a parallel arrangement by electrical connections between the groups of serially connected devices, and in particular said set of at least two devices may comprise interdigitated transducer electrode fingers protruding from two oppositely-located electrode bus-bar portions which are common to the devices of the set. The electrode fingers of one device of the set form a longitudinal extension of the electrode fingers of another device of the set. Furthermore, in the case of acoustic wave resonators, at least a plurality of said $N^2$ devices may have common reflective elements forming individul resonance cavities for the individual devices.

In the case of so-called "one-port" devices each of the $N^2$ devices has one pair of terminals which serves for coupling power both into and out of the device.

However parallel-series arrangements in accordance with the invention may alternatively have two or more ports so that each of the $N^2$ devices may have at least one input pair of terminals and at least one output pair of terminals. In the case of these multiple-port devices the grouping of serially-connected input terminal pairs may be either the same as or different from the grouping of serially-connected output terminal pairs as regards to which of the particular $N^2$ devices these terminal pairs belong. Thus, all the pairs of second terminals within each of N groups may belong to a group of N devices, all the pairs of first terminals of which belong to a common group of N first terminal pairs. Alternatively, the pairs of second terminals within each of N groups may belong to a group of N devices the pairs of first terminals of which do not belong to a common N group.

Embodiments of the present invention will now be described, by way of example, with reference to the accompanying diagrammatic drawings, in which.

It should be noted that the drawings are diagrammatic, and in particular the plan views of FIGS. 1, 5, 7, 8 and 11 are not drawn to scale. Various features in these device arrangements have been shown either exaggerated or reduced in size for convenience and clarity in the drawing. Furthermore, corresponding and similar features in the different embodiments are generally given the same reference symbols to facilitate understanding and comparison of the different embodiments.

Figure 1:
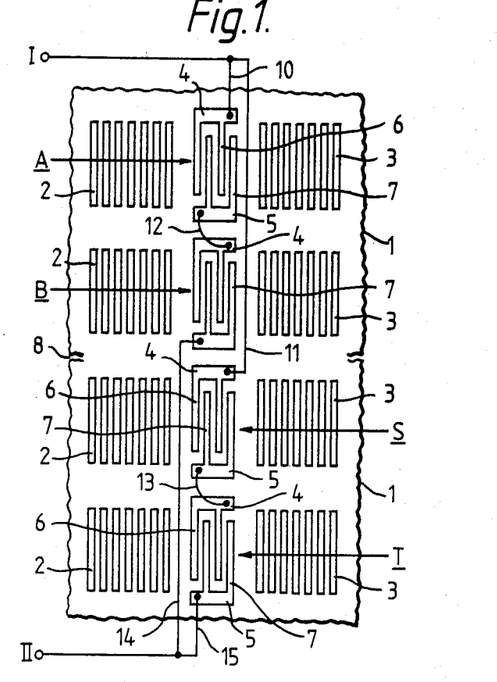
FIG. 1 is a plan view of a first acoustic wave device arrangement in accordance with the invention, having a parallel-series arrangement of four one-port resonators A, B, S and T.
Figure 2:
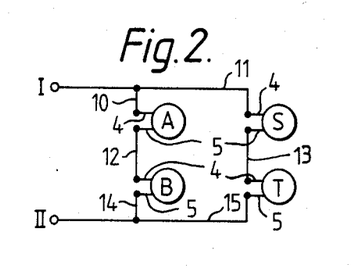
FIG. 2 is a block-circuit diagram of such a parallel-series arrangement of four resonators A, B, S and T as illustrated in FIG. 1.

The acoustic wave device arrangement of FIGS. 1 and 2 comprises at least one piezo-electric substrate 1 which in accordance with the present invention has $N^2$ acoustic wave devices with substantially the same electrical impedance and transfer characteristics. In this particular embodiment there are four such devices A, B, S and T (i.e. N=2). The substrate 1 may be of any known piezo-electric crystal material able to propagate acoustic waves. Peferably the crystal material and the major surface orientation of the substrate 1 are such that surface acoustic waves can be propagated in its upper major surface, e.g. a substrate of lithium niobate or quartz. However, instead of propagating surface waves, the substrate material may be such that bulk acoustic waves can be propagated parallel and close to the major surface. In this case, the substrate material may be, for example, a rotated Y-cut of quartz with propagation perpendicular to the X-axis. A general reference to acoustic waves in the remaining description will mean either these surface or bulk acoustic waves as appropriate to whichever known substrate material is adopted.

Each of the four devices A, B, S and T is an acoustic wave resonator and has a pair of spaced apart reflectors each of which comprises an array of parallel reflective elements 2 or 3 present at the upper major surface of the substrate 1. These spaced apart arrays of reflective elements 2 and 3 (each of which may be a groove in the substrate surface or a layer of electrically conductive material on the substrate surface) are dimensioned, positioned and orientated on the major surface of the substrate 1 in known manner so as to form for each resonator A, B, S and T an individual resonance cavity capable of supporting acoustic standing wave energy in the substrate 1 at resonant mode frequencies.

Each of the four devices A, B, S and T is a single-port resonator and so comprises in its resonance cavity a single electro-acoustic transducer having a pair of terminals 4,5 and an interdigital array of electrodes 6,7. Each pair of terminals 4 and 5 is formed by two oppositely-located bus-bar portions of the transducer electrodes in FIG. 1 and serves for coupling power both into and out of the individual resonator A, B, S or T. As illustrated in FIG. 1 a pair of electrode fingers 6,7 protrude from the oppositely-located bus-bar portions 4 and 5, the fingers 6 being interdigitated with the fingers 7. These transducer electrodes are dimensioned, positioned and orientated on the upper major surface in known manner for coupling with the acoustic standing wave energy of the cavity. The interdigitated length of overlap of the fingers 6 and 7 determines the breadth of the active device area over which the acoustic standing waves are generated in the resonant cavity. The transducer electrodes 4,6 and 5,7 and the reflective elements 2 and 3 may be formed of the same conductive material, for example aluminium.

In order to produce a compact arrangement with reliably consistent device characteristics for the devices A, B, S and T, it is preferable to fabricate all four resonators A, B, S and T together in common processing steps on a common device substrate 1. However, it should be noted that the arrangement of the interdigital fingers 6 and 7 and the reflective elements 2 and 3 on a common device substrate 1 is such that the resonators A, B, S and T do not interact to any great extent acoustically but are only connected together electrically as will be described hereinafter. Nonetheless all of the individual resonators A, B, S and T on the common substrate have their correspondingly biased electrode fingers substantially aligned with each other so that they generate a substantially aligned standing wave pattern in the common substrate 1. As indicated by reference 8 in FIG. 1 the resonator pairs A, B, and S,T may be provided in separate substrates if so desired, and each of the resonators A, B, S and T may even be provided in its own separate substrate.

In accordance with the present invention the four acoustically substantially independant resonators A, B, S and T are electrically connected together in a parallel-series arrangement consisting of two groups each of which comprises two resonators A, B or S, T the pairs of terminals 4,5 of which are electrically connected in series, the pairs of terminals 4,5 of each group A, B or S, T being electrically connected in parallel with the pairs of terminals 4,5 of the other group S, T or A, B respectively. Thus, the whole device arrangement of FIGS. 1 and 2 which results from these connections is a one-port resonator having a pair of terminals I and II between which the input signal is applied and from which the output signal is also derived.

The device terminal I is connected, for example by wires 10 and 11, to the electrode bus-bars 4 of the resonators A and S. The opposite electrode bus-bar 5 of the resonator A is connected, for example by a wire 12 to the bus-bar 4 of the resonator B to form a series arrangement of resonators A and B. Similarly resonator S is connected in series with resonator T, for example by a wire 13. The other device terminal II is connected, for example by wires 14 and 15, to the electrode bus-bars 5 of the resonators B and T.

Each of the resonators A, B, S and T of FIG. 1 is substantially identical. The device geometry and layout of the elements 2, 3, 4, 5, 6 and 7 of the resonators A, B, S and T are substantially the same, and the electrical impedance and transfer characteristics of each of these resonators A, B, S and T is also therefore substantially the same. It is known to represent the electrical impedance and transfer characteristics of one such acoustic wave resonator A, B, S or T by the electrical circuit diagram of FIG. 3.

Figure 3:
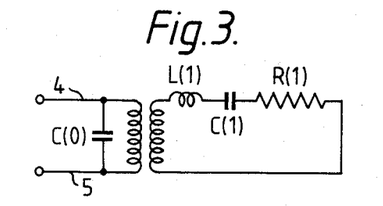
FIG. 3 is an equivalent circuit diagram of an individual one of the resonators A, B, S and T of FIG. 1.
Figure 4:
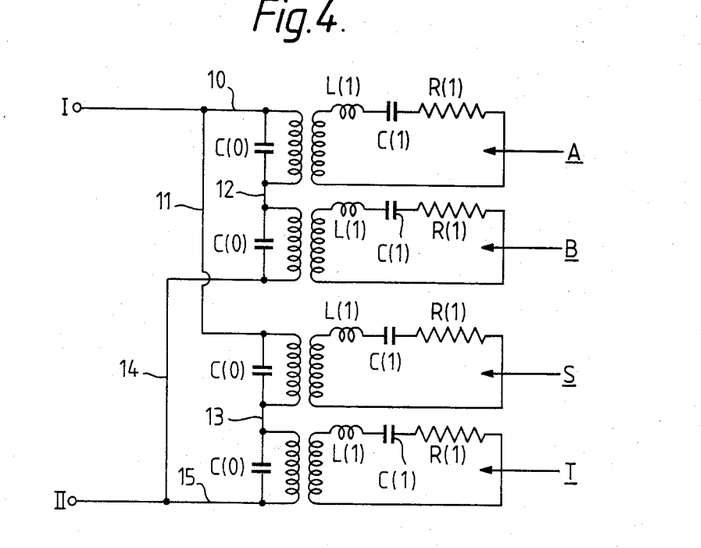
FIG. 4 is an equivalent circuit diagram of the parallel-series arrangement of the four resonators A, B, S and T of FIG. 1.

The equivalent circuit of FIG. 3 is valid for frequencies within the reflection band-width of the reflectors 2 and 3. In FIG. 3 the resonance cavity of the resonator A, B, S or T is represented by a series resonant equivalent circuit of inductor L(1), capacitor C(1) and resistor R(1). The actual electro-acoustic transducer located in the resonance cavity is represented by a capacitor C(0) coupled by an individual transformer to the series resonant circuit L(1), C(1), R(1). The equivalent circuit of the parallel-series arrangement of FIG. 1 is shown in FIG. 4. Analysis of the circuit network of FIG. 4 shows that it can be reduced to a single series resonant circuit L(1), C(1), R(1) coupled by a transformer to a single input/output capacitor C(0), in which the transformer and C(0), L(1), C(1) and R(1) have the same circuit values as for one individual resonator A, B, S or T. Thus, the circuit diagram of FIG. 3 is also that of the whole device arrangement of FIGS. 1, 2 and 4, and this whole device arrangement has substantially the same values of electrical impedance at its terminals I, II and transfer characteristics between its terminals I, II as does each of the individual resonators A, B, S or T at and between its electrode bus-bars 4 and 5.

However an important advantage of the parallel-series arrangement of FIGS. 1, 2 and 4 is that, while keeping the same impedance and transfer characteristics, the active device area is now quadrupled as compared with that of an individual resonator A, B, S or T. Thus, if the whole device arrangement is operated so that the individual resonators A, B, S and T are near their individual maximum power handling capability as related to the peak stress for acoustically-induced migration of the metallization in their individual active areas, the total power handled by the whole parallel-series arrangement of these devices A, B, S and T can be approximately four times greater. Thus, the acoustic wave resonator device arrangement of FIG. 1 can be used as a frequency control element to form a stable signal source in a low-noise oscillator. It is desirable to operate such an oscillator at a maximum power level into the acoustic wave resonator in order to minimize the ratio of phase-noise power to carrier power.

Figure 5:
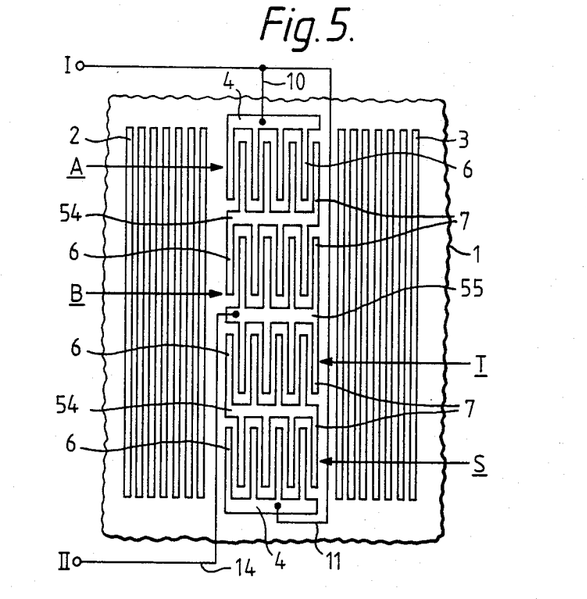
FIG. 5 is a plan view of a more compact, second acoustic wave device arrangement in accordance with the invention, also having four one-port resonators A, B, S and T in a parallel-series arrangement.

Many modifications are possible within the scope of this invention, particularly in terms of the number of individual devices, the device geometry and integration, device characteristics, and applications. FIG. 5 illustrates several modifications in device geometry. Firstly the four resonators A, B, S and T have common reflective elements 2, and 3 defining the resonance cavities. These common reflective elements 2 and 3 are arranged on opposite sides of an area in which all the individual resonator devices A, B, S and T are located. Although having all the reflective elements 2 and 3 in common, the individual resonators A, B, S and T are still acoustically substantially independant by virtue of the separation of their individual active device areas as determined by the overlap of the interdigitated fingers 6 and 7. If desired, only some of the resonators A, B, S and T may have common reflective elements 2, 3. Thus, for example, the devices A and B may have one set of common elements 2 and 3, and the devices S and T may have another set of common elements 2 and 3.

A second modification illustrated in FIG. 5 is that, instead of using wire connections 12 and 13, the series connections of the two resonators A and B and of the two resonators S and T are formed by common electrode bus-bar portions 54 from opposite sides of which the electrode fingers 6 and 7 protrude. These common bus-bar portions 54 between the two resonators are located in the parallel arms of the parallel-series arrangement and constitute one common terminal of the two resonators A and B, and S and T. Furthermore, since the number of electrode fingers employed in device arrangements in accordance with the invention can be varied in known manner to obtain appropriate device characteristics, FIG. 5 also illustrates resonators A, B, S and T having more interdigitated electrode fingers.

A third modification illustrated in FIG. 5 is that instead of using a wire connection 15 for the parallel connection of the resonators B and T, these two resonators B and T have a common electrode bus-bar 55 from opposite sides of which their electrode fingers 7 protrude. This bus-bar 55 constitutes one common terminal of the resonators B and T, and the correspondingly biased electrode fingers of all the resonators are again substantially aligned on the substrate 1. These second and third modifications using common bus-bars 54 and 55 result in a much more compact structure than that of FIG. 1, even though maintaining the same length of overlap of the interdigitated electrode fingers 6 and 7 as in the FIG. 1 device arrangement.

Figure 6:
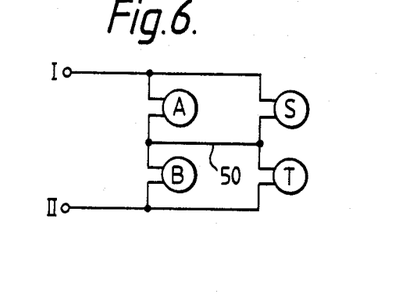
FIG. 6 is a block-circuit diagram of another parallel-series arrangement of four resonators A, B, S and T in an acoustic wave device arrangement in accordance with the invention.

FIG. 6 illustrates a further modification in which an electrical connection 50 is present between the parallel groups A, B and S, T at corresponding points of substantially the same voltage occurring between the devices A and B in one group and the devices S and T in the other group. This connection 50 may be, for example, a wire connected between the two bus-bar portions 54 of FIG. 5. However, as will be decribed later with respect to FIG. 7, such a connection 50 may also be achieved in a very compact manner by a common bus-bar portion between merged transducers A, S and B, T. The connection 50 is also equivalent to a series connection between a set of parallel devices A, S and a set of parallel devices B, T. An advantage of providing such a connection 50 between corresponding points in the parallel groups A, B and S, T is that it facilitates the compensation of any slight variation in the electrical characteristics of the individual devices A, B, S and T. Although in general the electrical impedance and transfer characteristics of all of the devices A, B, S and T may not be exactly identical, they are substantially the same, at least to the extent that each of the devices A, B, S and T meets the specification tolerance for the net characteristics of the whole parallel-series device arrangement A, B, S, T as specified for its particular application.

Figure 7:
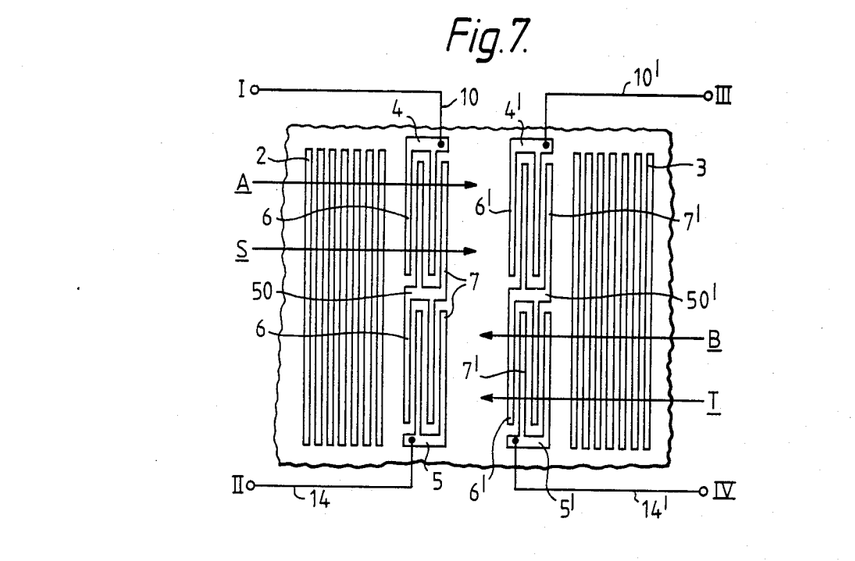
FIG. 7 is a plan view of an even more compact, third acoustic wave device arrangement of four two-port resonators A, B, S and T in accordance with the invention.

FIG. 7 illustrates the use of the invention with a two-port resonator and also with merged transducers A, S and B, T. Being a two-port resonator the whole device arrangement of FIG. 7 now has a pair of output terminals III, IV which are separate from the pair of input terminals I, II. Each of the individual resonator devices A, B, S and T comprises an input transducer connected in a parallel-series arrangement between the input terminal pair I, II, and an output transducer connected in a parallel-series arrangement between the output terminal pair III,IV. The number of fingers and geometry of the input and output transducers may be different, although FIG. 7 illustrates an example in which the output transducer is similar to the input transducer. The output transducer is spaced from the input transducer by a distance which is the same for all the resonators A, B, S and T.

In the FIG. 7 arrangement the transducers of the resonators A and S are merged together as a set in a parallel arrangement by the electrical connections formed between these devices by the two oppositely-located common bus-bars 4 and 50 for the input transducer, and 4' 50' for the output transducer. The interdigitated transducer electrode fingers 6 and 7 of the input transducers of both resonators A and S protrude from these common bus-bar portions 4 and 50, the fingers 6 of resonator S forming a longitudinal extension of the fingers 6 of resonator A, and the fingers 7 of resonator A forming a longitudinal extension of the fingers 7 of resonator S. The length of the overlap between the electrode fingers 6 and 7 in the interdigitation is now twice that which unmerged individual transducers would have. The bus-bars 4 and 50 constitute a common pair of terminals of the input transducers of resonators A and S. The output transducers of these two-port resonators A and S are similarly merged and comprise a common pair of terminals 4' and 50' and longitudinally-extended fingers 6' and 7'. Similarly, the resonators B and T are merged together as a set in a parallel arrangement by their common bus-bars (50 and 5 for the input transducer and 50' and 5' for the output transducer). The bus-bar 50 (or 50') also forms a serial connection between the parallel device set A,S and the parallel device set B,T. Unlike the embodiments of FIGS. 1 and 5, the resonator A in the FIG. 7 arrangement is no longer isolated acoustically from the resonator S, and the resonator B is no longer isolated acoustically from the resonator T. However, the correspondingly biased electrode fingers of all the resonators A, B, S and T are again substantially aligned on the substrate 1 so generating a substantially aligned standing wave pattern.

In the FIG. 7 embodiment the grouping of the serially-connected input terminal pairs 4,50 and 50,5 of the individual two-port resonator devices A, B, S and T is the same as the grouping of the serially-connected output terminal pairs 4',50' and 50',5' as regards to which of the particular resonator devices A, B, S and T these terminal pairs belong. However, the output terminal pairs of such multi-port resonators may be differently grouped from the input terminal pairs. Such different grouping may arise where the output transducers have a different geometry from the input transducers, but it may also be used where the geometry of the input and output transducers is the same. An example of this latter case is shown in FIG. 8.

Figure 8:
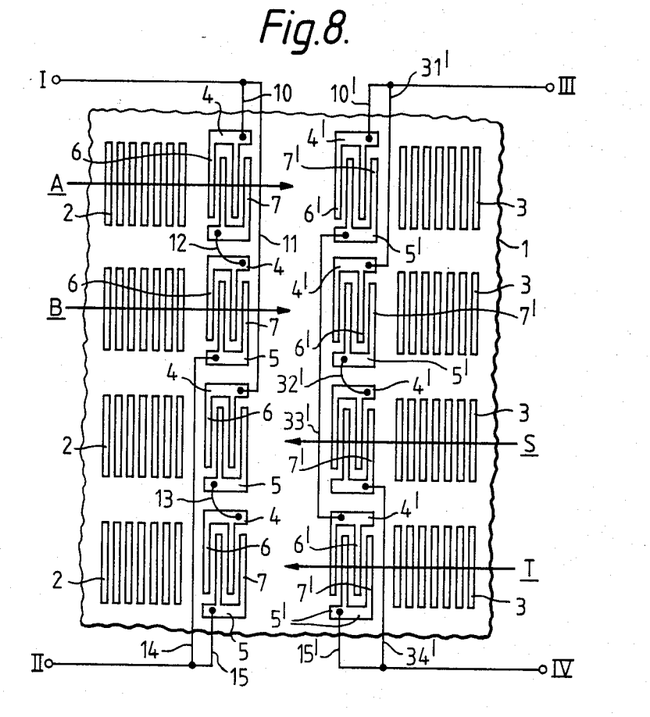
FIG. 8 is a plan view of a fourth acoustic wave device arrangement of four two-port resonators A, B, S and T in accordance with the invention but having their input and output ports differently grouped.
Figure 9:
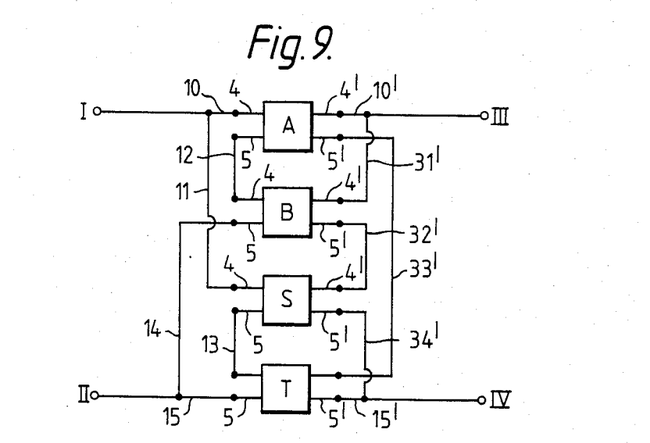
FIG. 9 is a block-circuit diagram of the parallel-series arrangement of FIG. 8.

FIG. 8 illustrates a two-port resonator device arrangement in which the input and output transducers of the individual two-port resonators A, B, S and T are similar to the single transducers of the one-port resonators A,B,S and T of FIG. 1. The input transducers in FIG. 8 are connected in the same manner as the single transducers of FIG. 1. Thus, the pairs of input terminals 4,5 of the resonators A and B are serially-connected in one group, and the pairs of input terminals 4,5 of the resonators S and T are serially-connected in another group, these two groups being connected in parallel across the input terminals I,II of the whole device arrangement. However the pairs of output terminals 4',5' of these resonators are grouped differently. The pairs of output terminals 4',5' of the resonators A and T are serially-connected in one group, and the pairs of output terminals 4',5' of the resonators B and S are serially-connected in another group, these two groups being connected in parallel across the output terminals III,IV. Thus, the output terminal pairs 4',5' within each of the two groups belong to a group of devices A, T or B, S the input terminal pairs of which do not belong to a common group of input terminals 4,5. FIG. 9 is a block circuit diagram of a two-port resonator device arrangement having these different parallel-series connections for the input and output terminal pairs.

Figure 10:
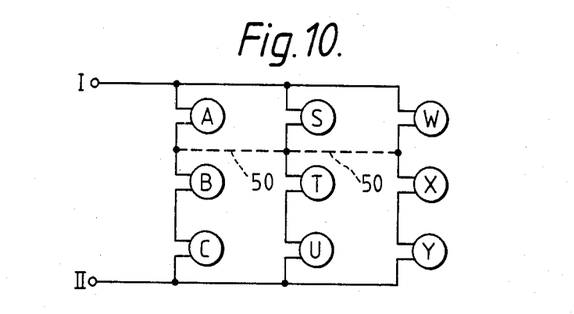
FIG. 10 is a block-circuit diagram of a parallel-series arrangement of nine acoustic wave devices in a device arrangement in accordance with the invention.

FIG. 10 illustrates one example of an acoustic wave device arrangement in accordance with the invention and having more than four devices in a parallel-serial arrangement. In the example of FIG. 10, the $N^2$ devices of substantially the same electrical impedance and transfer characteristics are nine in number (i.e. $N=3$). These nine devices are arranged in three groups of serially-connected devices, namely A, B, C, and S, T, U, and W, X, Y, which are connected in parallel. Connections 50 may connect the devices A, S, W in one parallel set and the devices B, T, X in another parallel set. Such connections 50 may also be present between the devices B, T, X and the devices C, U, Y, or they may be absent between any two of the three parallel groups or even totally absent from FIG. 10.

Figure 11:
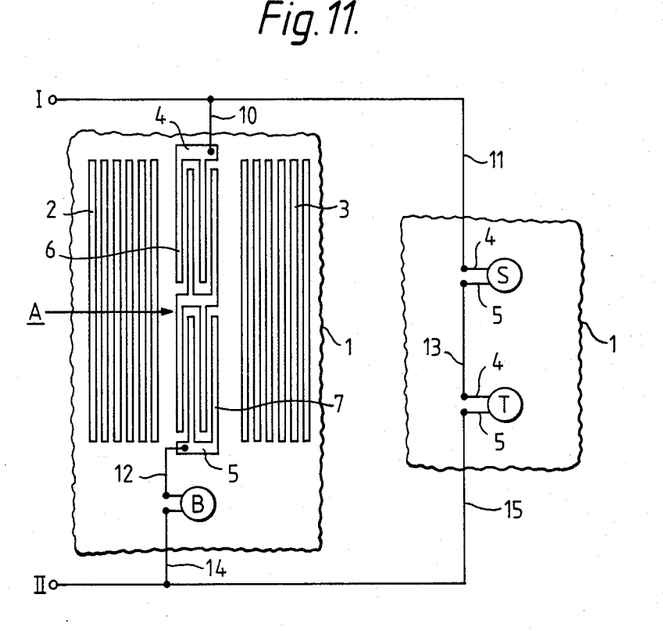
FIG. 11 is a partly plan-view and partly block-circuit diagram of yet another acoustic wave device arrangement in accordance with the invention, having a parallel-series arrangement of four one-port resonators, of which at least resonator (A) is composed of serially-connected device elements.

FIG. 11 illustrates a further modification in which at least one of the devices (A) comprises a plurality of device elements electrically connected together to form said one device (A) having the required electrical impedance and transfer characteristics. In this manner the active device area is increased even further so further increasing the power handling capability of the whole parallel-series arrangement of devices A, B, S and T. In the example of FIG. 11, the device A has substantially the same structure as the serially-connected arrangement of merged parallel transducers A, S and B, T of FIG. 7. By way of example in the FIG. 11 arrangement, the device group S, T is shown located on a separate substrate from the device group A, B. Provided all $N^2$ devices have substantially the same electrical impedance and transfer characteristics, the $N^2$ devices need not have the same transducer geometry or structure.

The present invention may also be used in two-port resonators having a grounded metal bar or a so-called multi-strip coupler provided in the centre of the resonance cavity between the input and output transducers of the $N^2$ resonator devices. In this case, the increased active area obtained in accordance with the invention can be important in alleviating acoustically-induced migration in the metal of such a center bar or multi-strip coupler.

Particularly in the case of bulk acoustic wave resonators, the resonance cavity may be defined by a pair of single deep grooves in the substrate surface or even by the side ends of the substrate.

Although the device arrangements illustrated in FIGS. 1, 5, 7, 8 and 11 are resonators having resonance cavities defined by reflectors, parallel-series arrangements in accordance with the present invention can be used with acoustic wave devices which do not comprise reflectors. Such devices may be for example SAW delay lines or transversal filters. Thus, the present invention may be employed in the design of SAW transversal filters to withstand high power levels.

Increasing the active device area by a parallel-series arrangement in accordance with the present invention may be used instead of doping aluminium metallization with copper to alleviate acoustically-induced migration in aluminium of the transducer electrode fingers and of other vulnerable parts of acoustic wave devices. However copper-doped aluminium metallization may also be used in a parallel-series device arrangement in accordance with the present invention so as to suppress aluminium migration at even higher power levels. Nonetheless, depending on the device application, such copper-doping in a device arrangement in accordance with the invention is not always desirable since it may decrease the Q factor.

What we claim is:

1. An acoustic wave device arrangement comprising at least one piezo-electric substrate including $N^2$ acoustic wave devices in which at the same operating frequency each of the devices have substantially the same electrical impedance and transfer characteristics, where N is an integer greater than unity, each device having at least one pair of terminals for coupling power into and out of said device, said $N^2$ devices being electrically connected in a parallel-series arrangement comprising N groups each of which comprises N of said devices with the corresponding pairs of terminals being electrically connected in series, the corresponding pairs of terminals in each group being electrically connected in parallel with the corresponding pairs of terminals in the other group or groups whereby at said operating frequency the device arrangement has substantially the same electrical impedance and transfer characteristics as each of the individual $N^2$ devices.

2. A device arrangement as claimed in claim 1, wherein at least two of said $N^2$ devices comprise transducer electrode fingers protruding from opposite sides of an electrode bus-bar portion forming a common terminal of said two devices to provide an electrical connection between said two devices.

3. A device arrangement as claimed in claim 2, wherein said electrode bus-bar portion is located between two devices in one of the groups of devices and connects said two devices in series at said common terminal.

4. A device arrangement as claimed in claim 2, wherein said electrode bus-bar portion is located at a connection between two groups and forms part of a parallel connection of said two devices at said common terminal.

5. A device arrangement as claimed in claim 1 further comprising at least one electrical connection between at least two groups of devices at corresponding points of substantially the same voltage occurring between devices in said groups.

6. A device arrangement as claimed in claim 5, wherein a set of at least two of said $N^2$ devices is merged together into a parallel arrangement by the electrical connections between the groups, said set of devices comprising interdigitated transducer electrode fingers protruding from two oppositely-located electrode bus-bar portions which are common terminals of the devices of the set, and the electrode fingers of one device of the set form a longitudinal extension of the electrode fingers of another device of the set.

7. An acoustic wave device arrangement comprising at least one piezo-electric substrate including $N^2$ acoustic wave devices for which at the same operating frequency all $N^2$ devices have substantially the same electrical impedance and transfer characteristics, where N is an integer greater than unity,
  each device having at least first and second pairs of terminals for coupling power into and out of said device,
  said $N^2$ devices being electrically connected in a parallel-series arrangement comprising N parallel-groups of which:
  the first terminals of the $N^2$ devices are grouped in N groups each of which comprises N serially-connected pairs of terminals,
  the second terminals are grouped in N groups each of which comprises N serially-connected pairs of terminals,
  and all the pairs of second terminals within each of the N groups belong to a group of N devices all the pairs of first terminals of which also belong to a common N group of the first terminals,
  the device arrangement thereby having substantially the same electrical impedance and transfer characteristics as each of the individual acoustic wave devices.

8. An accoustic wave device arrangement comprising at least one piezo-electric substrate including $N^2$ acoustic wave devices in which for a given operating frequency all of the devices have substantially the same electrical impedance and transfer characteristics, where N is an integer greater than unity,
  each device having at least first and second pairs of terminals for coupling power into and out of said device,
  said $N^2$ devices being electrically connected in a parallel-series arrangement comprising N parallel groups of which:
  the first terminals of the $N^2$ devices are grouped in N groups each of which comprises N serially-connected pairs of terminals, the second terminals are grouped in N groups each of which comprises N serially-connected pairs of terminals, and the pairs of second terminals within each of the N groups belong to a group of N devices the pairs of first terminals of which do not belong to a common N group of the first terminals, whereby the device arrangement has substantially the same electrical impedance and transfer characteristics as each of the individual $N^2$ devices.

9. A device arrangement as claimed in claim 1, wherein at least one of said $N^2$ devices comprises acoustic wave device elements electrically connected together to form said one device having the required electrical impedance and transfer characteristics but having an increased active area.

10. An acoustic wave resonator arrangement comprising at least one piezo-electric substrate including $N^2$ acoustic wave resonator devices wherein at a given operating frequency all of the $N^2$ devices have substantially the same electrical impedance and transfer characteristics, where N is an integer greater than unity, each device having a resonance cavity defined in the substrate and at least one pair of terminals for coupling power into and out of said device, said $N^2$ devices being electrically connected in a parallel-series arrangement comprising N groups each of which comprise N of said devices the corresponding pairs of terminals of which are electrically connected in series, the corresponding pairs of terminals in each group being electrically connected in parallel with the corresponding pairs of terminals in the other group or groups whereby the device arrangement has substantially the same electrical impedance and transfer characteristics as each of the individual $N^2$ devices.

11. A device arrangement as claimed in claim 10, wherein the resonance cavity is defined by a pair of spaced-apart reflector arrays each of which comprise reflective elements present at a major surface of the substrate.

12. A device arrangement as claimed in claim 10 wherein at least a plurality of said $N^2$ devices have common reflective elements defining the resonance cavities, said common reflector elements being arranged on opposite sides of an area of the major surface of the substrate, and wherein all devices of said plurality have transducer electrodes located in said area.

13. A device arrangement as claimed in claim 12, wherein all of the $N^2$ devices have common reflective elements at a major surface of a common substrate.

14. A device arrangement as claimed in claim 1, wherein the $N^2$ devices are surface acoustic wave devices.

15. A device arrangement as claimed in claim 1 wherein the $N^2$ devices are bulk acoustic wave devices.

16. A device arrangement as claimed in claim 7, wherein the $N^2$ devices are surface acoustic wave resonators and have a resonance cavity defined in the substrate.

17. A device arrangement as claimed in claim 8, wherein the $N^2$ devices are surface acoustic wave resonators and have a resonance cavity defined in the substrate.

* * * * *